(12) United States Patent
Yokura et al.

(10) Patent No.: US 7,644,623 B2
(45) Date of Patent: Jan. 12, 2010

(54) SEMICONDUCTOR SENSOR FOR MEASURING A PHYSICAL QUANTITY AND METHOD OF MANUFACTURING THE SAME

(75) Inventors: Hisanori Yokura, Obu (JP); Yoshihiko Isobe, Toyoake (JP); Eishi Kawasaki, Kuwana (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/010,758

(22) Filed: Jan. 29, 2008

(65) Prior Publication Data

US 2008/0202249 A1    Aug. 28, 2008

(30) Foreign Application Priority Data

Jan. 30, 2007   (JP)   ............... 2007-019316
Feb. 12, 2007   (JP)   ............... 2007-031413

(51) Int. Cl.
   *G01L 9/04*   (2006.01)
(52) U.S. Cl. ...................................... 73/726
(58) Field of Classification Search ............ 73/715, 73/726
   See application file for complete search history.

(56) References Cited

U.S. PATENT DOCUMENTS

| | | | |
|---|---|---|---|
| 4,768,011 A | | 8/1988 | Hattori et al. |
| 4,840,067 A | | 6/1989 | Nishida et al. |
| 4,986,861 A | | 1/1991 | Nishida et al. |
| 5,186,055 A | * | 2/1993 | Kovacich et al. ............ 73/727 |
| 5,264,820 A | * | 11/1993 | Kovacich et al. ............ 338/42 |
| 5,421,953 A | | 6/1995 | Nagakubo et al. |
| 5,466,961 A | * | 11/1995 | Kikuchi et al. ............ 257/379 |
| 5,471,086 A | * | 11/1995 | Ipposhi et al. ............ 257/417 |
| 5,510,276 A | | 4/1996 | Diem et al. |
| 5,693,959 A | * | 12/1997 | Inoue et al. ............ 257/66 |
| 5,872,315 A | * | 2/1999 | Nagase et al. ............ 73/726 |

(Continued)

FOREIGN PATENT DOCUMENTS

JP    A-02-168133    6/1990

(Continued)

OTHER PUBLICATIONS

Office Action dated Oct. 31, 2008 in corresponding Japanese patent application No. 2007-019316 (and English translation).

(Continued)

*Primary Examiner*—Lisa M Caputo
*Assistant Examiner*—Jermaine Jenkins
(74) *Attorney, Agent, or Firm*—Posz Law Group, PLC

(57) ABSTRACT

A semiconductor pressure sensing apparatus includes a metallic stem having a diaphragm and a semiconductor sensor bonded to the diaphragm. The semiconductor sensor includes a gauge section and first and second bonding pads. The gauge section is configured to be deformed according to a deformation of the diaphragm. The first and second bonding pads are respectively connected to different positions of the gauge section so that an electrical resistance between the first and second bonding pads can change with a change in the deformation of the diaphragm. The gauge section is formed to a semiconductor layer of an silicon-on-insulator substrate. The semiconductor sensor is directly bonded to the diaphragm by activating contact surfaces between the semiconductor sensor and the diaphragm.

17 Claims, 10 Drawing Sheets

U.S. PATENT DOCUMENTS

| | | | |
|---|---|---|---|
| 5,912,499 A | 6/1999 | Diem et al. | |
| 6,085,596 A | 7/2000 | Jensen et al. | |
| 6,250,165 B1 * | 6/2001 | Sakai et al. | 73/754 |
| 6,441,451 B1 * | 8/2002 | Ikeda et al. | 257/418 |
| 6,595,065 B2 * | 7/2003 | Tanizawa et al. | 73/720 |
| 6,595,067 B2 * | 7/2003 | Suzuki et al. | 73/754 |
| 6,635,910 B1 | 10/2003 | Gross | |
| 6,756,248 B2 * | 6/2004 | Ikeda et al. | 438/53 |
| 6,860,154 B2 * | 3/2005 | Yamamoto et al. | 73/718 |
| 6,865,953 B2 | 3/2005 | Tsukada et al. | |
| 6,997,058 B2 * | 2/2006 | Toyoda | 73/726 |
| 7,152,483 B2 * | 12/2006 | Mast | 73/754 |
| 7,540,198 B2 | 6/2009 | Ichikawa | |
| 2002/0148297 A1 | 10/2002 | Suzuki et al. | |

FOREIGN PATENT DOCUMENTS

| | | |
|---|---|---|
| JP | A-5-343705 | 12/1993 |
| JP | A-05-343705 | 12/1993 |
| JP | A-2000-039371 | 2/2000 |
| JP | A-2000-155062 | 6/2000 |
| JP | A-2001-352078 | 12/2001 |
| JP | A-2002-013997 | 1/2002 |
| JP | A-2004-247415 | 9/2004 |
| JP | A-2005-028504 | 2/2005 |
| JP | A-2008-064526 | 3/2008 |

OTHER PUBLICATIONS

Office Action dated May 7, 2009 from the German Patent Office in the corresponding DE Application No. 10 2008 000 128.7 (and English Translation).

Jin Ji, et al., "An Ultraminiature CMOS Pressure Sensor for a Multiplexed Cardiovascular Catheter," Oct. 1992, *IEEE Transactions on Electron Devices*, vol. 39, No. 10, pp. 2260-2267.

Office Action dated Apr. 21, 2009 from the Japan Patent Office in the corresponding JP application No. 2007-19316 (and English Translation).

Office Action dated May 26, 2009 from the Japan Patent Office in the corresponding JP application No. 2007-31413 (and English Translation).

* cited by examiner

SEMICONDUCTOR SENSOR FOR MEASURING A PHYSICAL QUANTITY AND METHOD OF MANUFACTURING THE SAME

CROSS REFERENCE TO RELATED APPLICATION

This application is based on and incorporates herein by reference Japanese Patent Applications No. 2007-19316 filed on Jan. 30, 2007 and No. 2007-31413 filed on Feb. 12, 2007.

FIELD OF THE INVENTION

The present invention relates to a semiconductor sensor and a method of manufacturing the semiconductor sensor.

BACKGROUND OF THE INVENTION

In a semiconductor pressure sensor disclosed in U.S. Pat. No. 6,635,910, a heavily-doped region serving as a gauge section is formed to a surface portion of a semiconductor substrate by an ion-implantation process, a thermal diffusion process, and the like. The semiconductor substrate of the semiconductor pressure sensor is attached to a thinned portion of an object to be detected. When receiving pressure, the thinned portion of the object is deformed according to an amount of the received pressure. The semiconductor substrate (i.e., the gauge section) attached to the thinned portion is deformed accordingly. An electrical resistance of the gauge section changes according to a degree of the deformation of the gauge section. Therefore, the pressure applied to the object can be detected based on the electrical resistance of the gauge section. A thickness of the surface portion of the semiconductor substrate, where the gauge section is formed, is approximately 2 micrometer (μm), and a total thickness of the semiconductor substrate is between 10 μm and 14 μm.

It is difficult to adjust a depth to which ions are implanted to form the heavily doped region. In such a conventional pressure sensor, therefore, after the ion-implantation process is finished, the thermal diffusion process is performed to achieve uniform impurity concentration of the heavily doped region.

However, it is difficult to control the diffusion in the semiconductor substrate. Therefore, even when the thermal diffusion process is performed, variations in impurity profile may occur. The variations in the impurity profile result in variations in the electrical resistance of the gauge section. The variations in the electrical resistance of the gauge section cause a reduction in detection accuracy. The same problem can arise for other semiconductor sensors such as a semiconductor temperature sensor, which detects a volume change due to a temperature change of an object as an electrical resistance change of a gauge section.

In a pressure sensing apparatus disclosed in U.S. Pat. No. 4,840,067 corresponding to JP-A-H7-11461, such a semiconductor pressure sensor is attached to a diaphragm integrally formed with a metallic stem through a low-melting glass. To reduce thermal stress, the metallic stem (i.e., diaphragm) is required to be made of a material having a thermal expansion coefficient close to a thermal expansion coefficient of a semiconductor substrate (i.e., silicon) of the semiconductor pressure sensor. Therefore, the metallic stem is made of a special material such as kovar, which is more costly and has less workability than a general material such as a stainless steel (SUS). Since a housing for accommodating the metal stem is made of such a general material, the stem cannot be fixed to the housing by welding. Further, the low-melting glass is melt during a bonding process in which the semiconductor pressure sensor is attached to the diaphragm of the stem. Therefore, the low-melting glass may not be accurately positioned with respect to the diaphragm. As a result, the semiconductor pressure sensor may be displaced from a correct location on the diaphragm. The displacement of the semiconductor pressure sensor causes a reduction in detection accuracy.

SUMMARY OF THE INVENTION

In view of the above-described problem, it is an object of the present invention to provide a semiconductor sensor for accurately detecting physical quantity, and to provide a method of manufacturing the semiconductor sensor.

According to one aspect of the present invention, a semiconductor sensor includes an insulating layer, a semiconductor layer disposed on the insulating layer, and first and second bonding pads. The semiconductor layer has at least one gauge section configured to be deformed according to an amount of physical quantity applied thereto. The first and second bonding pads are respectively connected to different positions of the gauge section so that an electrical resistance between the first and second bonding pads can change with a change in the amount of the applied physical quantity. Ions implanted into the semiconductor layer remain in the semiconductor layer without penetrating through the insulating layer. The ions remaining in the semiconductor substrate can be uniformly diffused over the semiconductor layer, for example, by a thermal diffusion process. Thus, an impurity concentration of the semiconductor layer becomes uniform.

According to another aspect of the present invention, a method of manufacturing a semiconductor sensor includes preparing a silicon-on-insulator substrate that includes a base substrate, a buried insulating layer disposed on the base substrate, and a semiconductor substrate disposed on the insulating layer. The method further includes forming at least one gauge section to the semiconductor layer in such a manner that the gauge section is deformed according to an amount of physical quantity applied thereto. The method further includes connecting first and second bonding pads to different positions of the gauge section.

According to another aspect of the present invention, a pressure sensing apparatus includes a housing, a metallic stem, and a sensor chip including a sensing section. The housing has a pressure passageway provided with a pressure inlet port for introducing pressure into the pressure passageway. The metallic stem has a diaphragm at a first side and an opening at a second side. The stem is placed in the pressure passageway in such a manner that the introduced pressure is applied to a back surface of the diaphragm through the opening. The sensor chip has a front surface provided with the sensing section and a back surface directly bonded to a front surface of the diaphragm.

According to another aspect of the present invention, a method of manufacturing a pressure sensing apparatus includes preparing a housing having a pressure passageway provided with a pressure inlet port for introducing pressure into the pressure passageway. The method further includes placing a metallic stem, which has a diaphragm at a first side and an opening at a second side, in the pressure passageway in such a manner that the introduced pressure is applied to a back surface of the diaphragm through the opening. The method further includes preparing a sensor chip, which includes a sensing section and has a front surface provided with the sensing section. The method further includes activating a front surface of the diaphragm and a back surface of the sensor chip. The method further includes generating electrostatic attraction force between the front surface of the diaphragm and the back surface of the sensor chip. The method further includes bonding the activated back surface of the sensor chip directly to the activated front surface of the diaphragm by the electrostatic attraction force.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
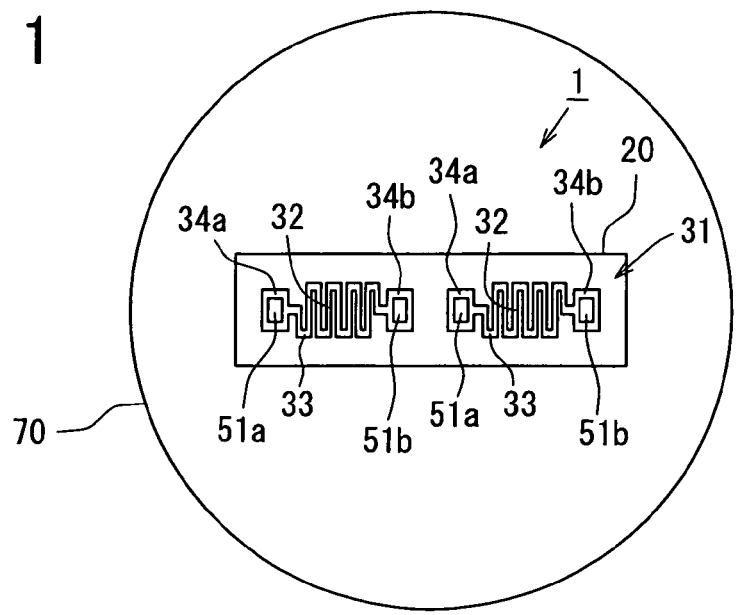
FIG. 1 is a diagram illustrating a top view of a semiconductor pressure sensor, which is mounted to a stem, according to a first embodiment of the present embodiment.
Figure 2:
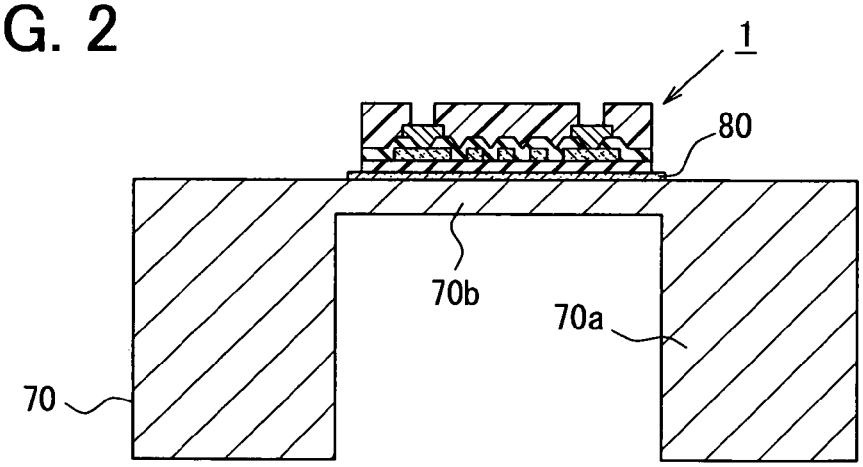
FIG. 2 is a diagram illustrating a cross-sectional view of FIG. 1.
Figure 3:
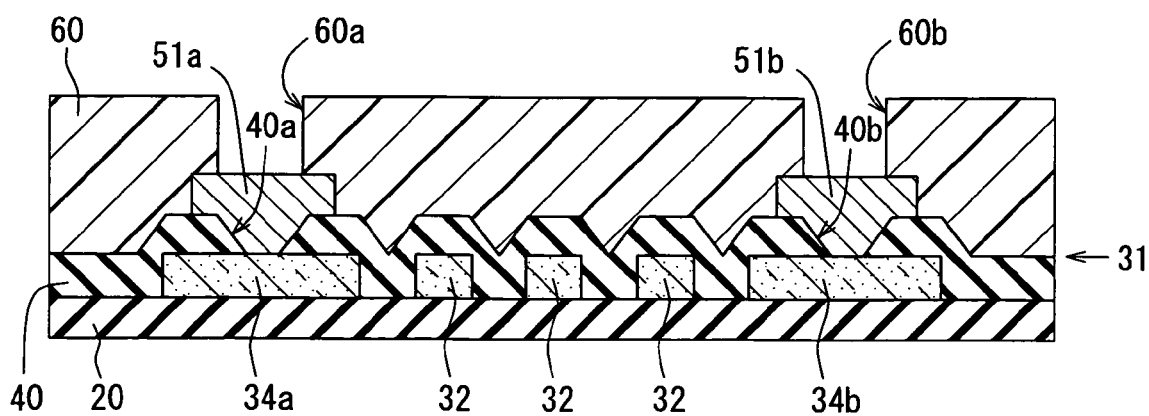
FIG. 3 is a diagram illustrating an enlarged cross-sectional view of the semiconductor pressure sensor of FIG. 1.

Referring to FIGS. 1-3, a semiconductor sensor 1 according to a first embodiment of the present invention is mounted substantially in the center of an outer surface of a top wall of a hollow cylindrical stem 70 made of a metallic material such as aluminum (Al), aluminum alloy, or the like. The semiconductor sensor 1 includes a gauge section 31 formed to a semiconductor layer on a buried insulating layer 20 of a silicon on insulator (SOI) substrate. Although FIGS. 2, 3 illustrate one gauge section 31, the semiconductor sensor 1 practically includes two gauge sections 31 that are arranged in series to form a half bridge circuit, as shown in FIG. 1.

The gauge section 31 is thin and has a thickness of 1 micrometer (μm), for example. The gauge section 31 has a zigzag portion and first and second bonding pads 34a, 34b. The zigzag portion has a plurality of straight and bent portions 32, 33 that are connected to each other to form a zigzag shape. The zigzag shape allows an electrical resistance of the gauge section 31 to be set to a desired value without increasing the size of the gauge section 31 relative to a thinned portion 70b of the stem 70. Thus, the semiconductor sensor 1 can be small in size.

The zigzag portion has a first end connected to the first bonding pad 34a and a second end connected to the second bonding pad 34b. The semiconductor sensor 1 can be electrically connected to an external device through the first and second bonding pads 34a, 34b. The first and second bonding pads 34a, 34b are respectively provided with first and second electrodes 51a, 51b made of a metallic material such as aluminum (Al), aluminum alloy, or the like.

The stem 70 includes a tube portion 70a and the thinned portion 70b. The tube portion 70a has a thickness enough to serve as a supporting base. The thinned portion 70b is integrally formed with the tube portion 70a to cover a hollow of the tube portion 70a. The thinned portion 70b is thin enough to be deformed according to a change in pressure in ambient atmosphere.

The gauge section 31 is formed on the insulating layer 20, which is bonded to the outer surface of the thinned portion 70b of the stem 70 through an adhesive member 80 such as a low melting glass. For example, the insulating layer 20 has a thickness of 1 μm and is made of silicon oxide (SiO2). The gauge section 31 is electrically insulated from the thinned portion 70b of the stem 70 by the insulating layer 20.

As shown in FIG. 3, the gauge section 31 is covered with an insulation film 40 to improve the electrical insulation of the gauge section 31. Specifically, the insulation film 40 covers the first and second bonding pads 34a, 34b, the straight and bent portions 32, 33, and space between adjacent straight portions 32. The insulation film 40 has first and second through holes 40a, 40b that are respectively formed in corresponding positions to the first and second bonding pads 34a, 34b. The first and second bonding pads 34a, 34b are at least partially exposed outside the insulation film 40 through the first and second through holes 40a, 40b. The first and second electrodes 51a, 51b are respectively formed on and electrically connected to the first and second bonding pads 34a, 34b through the first and second through holes 40a, 40b. Thus, the gauge section 31 can be electrically connected to the external device through the first and second electrodes 51a, 51b, so that the semiconductor sensor 1 can output a sensor signal indicative of a detected pressure to the external device.

Further, as shown in FIG. 3, the semiconductor sensor 1 includes a protection film 60. The protection film 60 is disposed on the insulation film 40 to protect the semiconductor sensor 1. For example, the protection film 60 has a thickness of 50 μm and is made of polyimide. The protection film 60 has first and second through holes 60a, 60b that are respectively formed in corresponding positions to the first and second electrodes 51a, 51b. The first and second electrodes 51a, 51b are at least partially exposed outside the protection film 60 through the first and second through holes 60a, 60b, so that the semiconductor sensor 1 can be electrically connected to the external device.

The protection film 60 protects the gauge section 31 from an external force applied to the semiconductor sensor 1. Further, the semiconductor sensor 1 can be mounted to the thinned portion 70b of the stem 70 by holding the protection film 60. Thus, the holding force applied to the gauge section 31 is reduced by the protection film 60 so that the gauge section 31 can be protected from a large holding force. Although the protection film 60 has a large thickness of 50 μm, deformability of the semiconductor sensor 1 can be ensured due to the fact that the protection film 60 is made of soft material such as polyimide.

In practice, the semiconductor sensor 1 includes two gauge sections 31 arranged in series to form a half bridge circuit, as shown in FIG. 1. Since the two gauge sections 31 are formed on a single SOI substrate, the two gauge sections 31 can be easily, accurately positioned with respect to each other. Thus, an accurate half bridge circuit can be formed so that the semiconductor sensor 1 can have high detection accuracy.

When pressure in the ambient atmosphere of the semiconductor sensor 1 increases, pressure applied to an inner surface of the thinned portion 70b increases. As a result, the thinned portion 70b is deformed greatly. Accordingly, the semiconductor sensor 1 (specifically, the gauge section 31) is deformed greatly. When the gauge section 31 is deformed greatly, the electrical resistance between the first and second bonding pads 34a, 34b changes greatly.

When the pressure in the ambient atmosphere of the semiconductor sensor 1 decreases, the pressure applied to the inner surface of the thinned portion 70b decreases. As a result, the thinned portion 70b is deformed very little, i.e., returns to substantially its original shape. Accordingly, the semiconductor sensor 1 (specifically, the gauge section 31) returns to substantially its original shape. When the gauge section 31 returns to substantially its original shape, the electrical resistance between the first and second bonding pads 34a, 34b changes very little, i.e., returns substantially its initial resistance value.

Thus, the pressure in the ambient atmosphere of the semiconductor sensor 1 can be detected based on the change in the electrical resistance between the first and second bonding pads 34a, 34b.

As previously mentioned, the gauge section 31 is formed to the semiconductor layer 30 of the SOI substrate. Due to factors resulting from manufacturing processes of a SOI substrate, it is likely that impurity concentration of a semiconductor layer 30 of the SOI substrate is substantially uniform for the following reasons.

A typical SOI substrate is formed in such a manner that a first silicon wafer having a buried insulating film formed thereon is joined to a second silicon wafer by thermocompression bonding, and then the second silicon wafer is partially grained or polished. A silicon ingot for the silicon wafers is formed by using a known Czochralski process. In the Czochralski process, a piece (i.e., seed) of silicon monocrystal suspended by a piano wire is soaked in silicon melt, and then the piano wire is gradually pulled up. The silicon seed grows to the silicon ingot over a long period of time, and an impurity doping is repeatedly performed at given intervals during the growth of the silicon seed. Thus, the doped impurities are uniformly diffused in the silicon ingot, and the silicon ingot has a uniform impurity concentration.

Therefore, since the impurity concentration of the semiconductor layer 30 of the SOI substrate is substantially uniform, variations in impurity profile of the semiconductor layer 30 can be reduced. As a result, variations in the electrical resistance of the gauge section 31 formed to the semiconductor layer 30 can be reduced so that variations in pressure detection accuracy can be reduced. Thus, the semiconductor sensor 1 can accurately detect pressure.

According to the present embodiment, the thickness of the semiconductor layer 30 (i.e., gauge section 31) is set to 1 μm to reduce stiffness of the gauge section 31. Further, a base substrate of the SOI substrate is eliminated to reduce stiffness of the semiconductor sensor 1. In such an approach, the gauge section 31 can be deformed exactly according to the deformation of the thinned portion 70b of the stem 70. Thus, the semiconductor sensor 1 can accurately detect pressure.

Figure 4A:
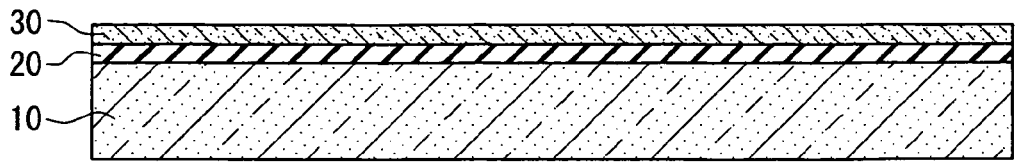
FIGS. 4A-4F are diagrams illustrating a manufacturing method of the semiconductor pressure sensor of FIG. 1.

A method of manufacturing a semiconductor pressure sensor unit having the semiconductor sensor 1 is described below with reference further to FIGS. 4A-4F. First, as shown in FIG. 4A, a SOI substrate is prepared. The SOI substrate has a buried insulating layer 20 formed on a surface of a base substrate 10 made of silicon, for example. The insulating layer 20 is made of silicon oxide (SiO2). The SOI substrate is formed by the known Czochralski process and impurity doping process previously mentioned. The SOI substrate has a thickness of about 8 μm, and a semiconductor layer 30 formed on the insulating layer 20 of the SOI substrate has a thickness of about 1 μm. For example, the semiconductor layer 30 has an uniform impurity concentration of about between $1 \times 10^{19}$ cubic centimeter $(cm^{-3})$ and $1 \times 10^{20}$ $cm^{-3}$. When the impurity concentration of the semiconductor layer 30 is set in the range between $1 \times 10^{19}$ $cm^{-3}$ and $1 \times 10^{20}$ $cm^{-3}$, an electrical resistance of the gauge section 31 changes greatly with a deformation of the gauge section 31, and an electrical characteristic of the gauge section 31 changes little with a temperature change of the gauge section 31.

Figure 4B:
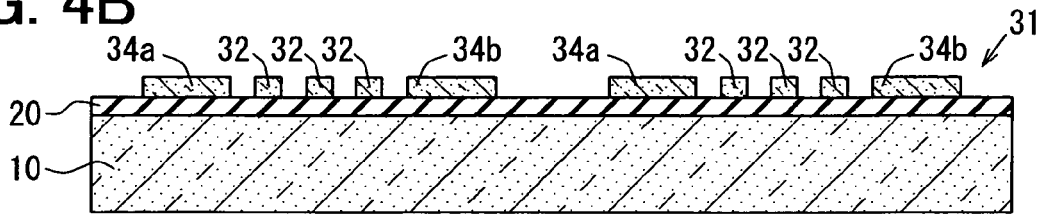

After the SOI substrate is prepared, as shown in FIG. 4B, the semiconductor layer 30 of the SOI substrate is patterned by an etching process, for example. Specifically, unnecessary portions of the semiconductor layer 30 is removed by the etching process to form the gauge section 31 (i.e., straight and bent portions 32, 33, and first and second bonding pads 34a, 34b). As previously mentioned, the semiconductor sensor 1 includes two gauge sections 31 arranged in series to form a half bridge circuit. Therefore, as shown in FIG. 4B, the semiconductor layer 30 is patterned to form a pair of gauge sections 31.

Figure 4C:
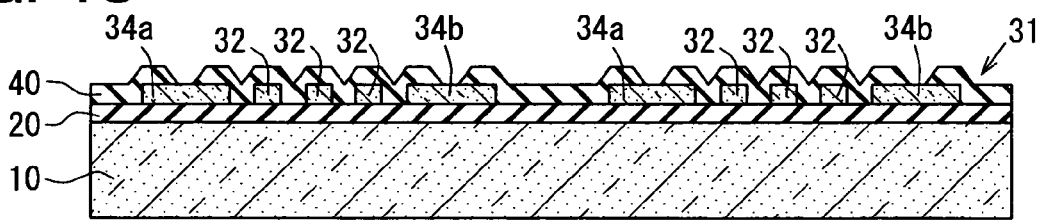

Then, as shown in FIG. 4C, an insulation film 40 is formed on the gauge section 31 to cover the gauge section 31. The insulation film 40 has a thickness of 1 μm and is made of silicon oxide (SiO2), for example. Specifically, the insulation film 40 covers the first and second bonding pads 34a, 34b, the straight and bent portions 32, 33, and space between adjacent straight portions 32. Further, first and second through holes 40a, 40b are respectively formed in the insulation film 40 at positions corresponding to centers of the first and second bonding pads 34a, 34b, so that the first and second bonding pads 34a, 34b can be at least partially exposed outside the insulation film 40. The insulation film 40 reduces electromagnetic noise transmitted to the gauge section 31.

Figure 4D:
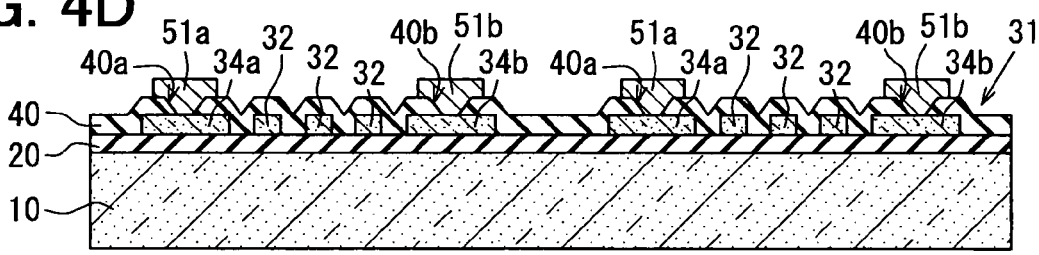

Then, as shown in FIG. 4D, first and second electrodes 51a, 51b are respectively formed on and electrically connected to the first and second bonding pads 34a, 34b through the first and second through holes 40a, 40b. For example, the first and second electrodes 51a, 51b are made of a metallic material such as aluminum, aluminum alloy, or the like. Alternatively, the first and second electrodes 51a, 51b can be made of a semiconductor material such as polysilicon. The first and second electrodes 51a, 51b can be formed by a conventional process such as a patterning process using a photo mask, a plating process, an inkjet process, a mask deposition process, or the like.

Figure 4E:
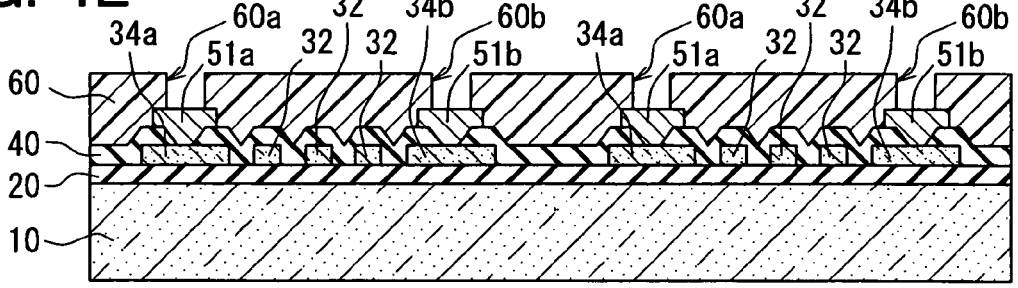

After the first and second electrodes 51a, 51b are formed, a protection film 60 is formed on the insulation film 40 and the first and second electrodes 51a, 51b, as shown in FIG. 4E. The protection film 60 has a thickness of 50 μm and is made of polyimide, for example. Further, first and second through holes 60a, 60b are respectively formed in the protection film 60 at positions corresponding to the first and second electrodes 51a, 51b, so that the first and second electrodes 51a, 51b can be at least partially exposed outside the protection film 60. The protection film 60 protects the gauge section 31 from an external force applied to the semiconductor sensor 1. Further, the semiconductor sensor 1 can be mounted to the thinned portion 70b of the stem 70 by holding the protection film 60. Thus, the holding force applied to the gauge section 31 is reduced by the protection film 60 so that the gauge section 31 can be protected from a large holding force.

Figure 4F:
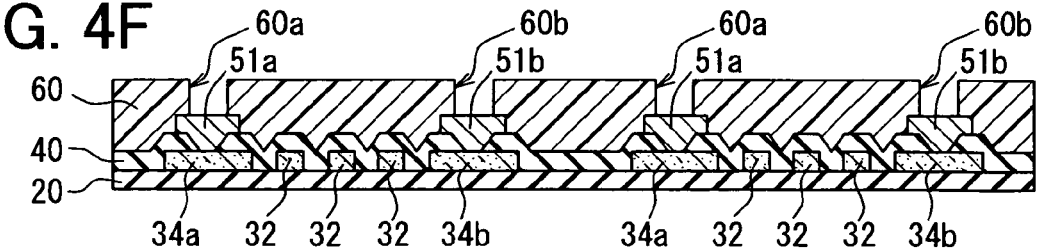

Then, as shown in FIG. 4F, the base substrate 10 of the SOI substrate is gradually removed by mechanically polishing the SOI substrate from its back side. Thus, the semiconductor sensor 1 illustrated in FIG. 3 is completed.

After the completion of the semiconductor sensor 1, the semiconductor sensor 1 is bonded to substantially the center of the thinned portion 70b of the stem 70 through the adhesive member 80 such as low melting glass. Thus, the semiconductor pressure sensor unit illustrated in FIGS. 2, 3 is completed.

(Modifications of First Embodiment)

The first embodiment described above may be modified in various ways. According to the first embodiment, the stem 70 is made of a metallic material. Alternatively, the stem 70 can be made of a material than a metallic material. For example, the stem 70 can be made of a resin material such as rubber having a high elasticity. In short, the stem 70 can be made of any material that can be deformed according to a change in pressure in ambient atmosphere of the semiconductor sensor 1.

Figure 5:
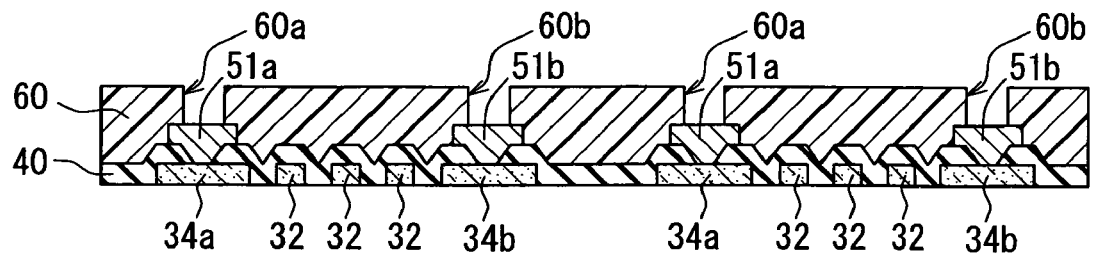
FIG. 5 is a diagram, corresponding to FIG. 4F, illustrating another manufacturing method of the semiconductor pressure sensor of FIG. 1.

Since the stem 70 is made of a metallic material, the insulating layer 20 is left to provide an electrical insulation between the gauge section 31 and the stem 70. Alternatively, when the electrical insulation between the gauge section 31 and the stem 70 is ensured without the insulating layer 20, the insulating layer 20 can be removed as illustrated in FIG. 5, which corresponds to FIG. 4F. For example, the insulating layer 20 can be gradually removed by mechanically polishing the SOI substrate from its back side.

Figure 6:
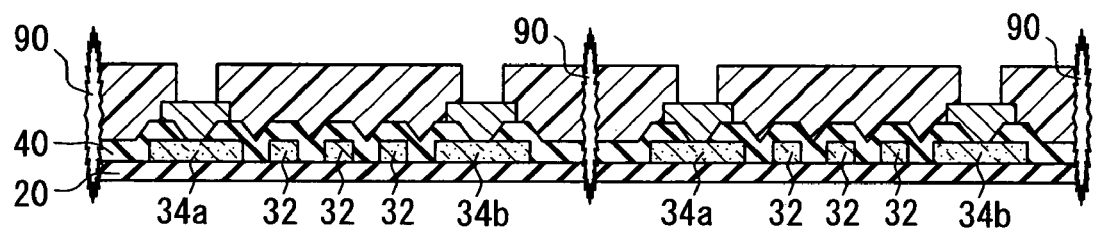
FIG. 6 is a diagram illustrating another manufacturing method of the semiconductor pressure sensor of FIG. 1.

According to the first embodiment, the semiconductor sensor 1 includes two gauge sections 31, which are formed to a single SOI substrate and arranged in series to form a half bridge circuit. Thus, the semiconductor sensor 1 can have high detection accuracy. Alternatively, the semiconductor sensor 1 may include four gauge sections 31, which are formed to a single SOI substrate and arranged in a full bridge configuration. In such an approach, the semiconductor sensor 1 can have higher detection accuracy. If a required detection accuracy is relatively low, the semiconductor sensor 1 may have one gauge section 31 formed to a single SOI substrate. In this case, as shown in FIG. 6, a plurality of gauge sections 31 may be formed to a single SOI substrate and separated from each other by cutting the SOI substrate with a dicing saw 90.

Figure 7:
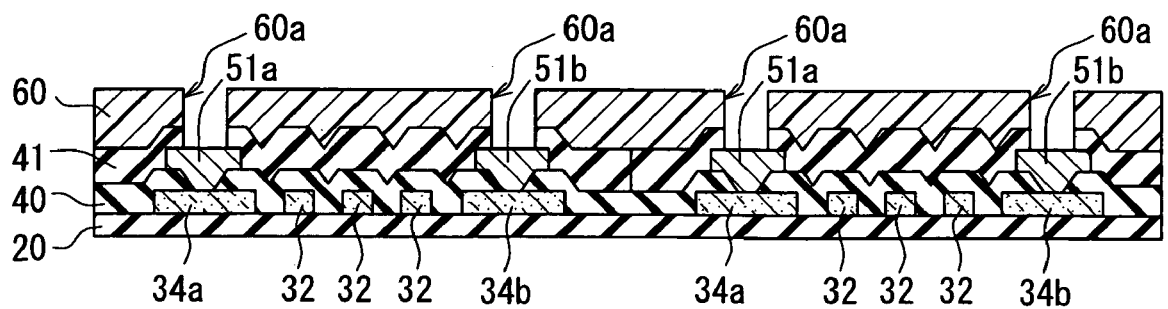
FIG. 7 is a diagram, corresponding to FIG. 3, illustrating a cross-sectional view of a semiconductor pressure sensor according to a modification of the first embodiment.

As illustrated in FIG. 7 corresponding to FIG. 3, an additional protection film 41 may be formed between the insulation film 40 and the protection film 60. In this case, a process for forming the additional protection film 41 is interposed between the processes illustrate by FIGS. 4D, 4E. The additional protection film 41 is formed to cover the insulation film 40 and top and side surfaces of the first and second electrodes 51a, 51b by a plasma chemical vapor deposition (CVD) process, for example. The additional protection film 41 may be made of silicon nitride (SiN), for example. If the gauge section 31 is exposed to water, an unwanted current flows in the gauge section 31 through water. As a result, variations in the electrical resistance of the gauge section 31 occur, and the detection accuracy of the semiconductor sensor 1 is reduced. The additional protection film 41 surely prevents the gauge section 31 from being exposed to water. Thus, the detection accuracy of the semiconductor sensor 1 can be ensured by the additional protection film 41.

According to the first embodiment, the gauge section 31 is covered with the insulation film 40 having electrical insulation capability to reduce the electromagnetic noise transmitted to the gauge section 31. Alternatively, the insulation film 40 can be eliminated from the semiconductor sensor 1, if the detection accuracy of the semiconductor sensor 1 can be ensured regardless of the electrical noise transmitted to the gauge section 31, or if the electrical noise is unlikely to be transmitted to the gauge section 31. Also, the protection film 60 can be eliminated from the semiconductor sensor 1.

Figure 8:
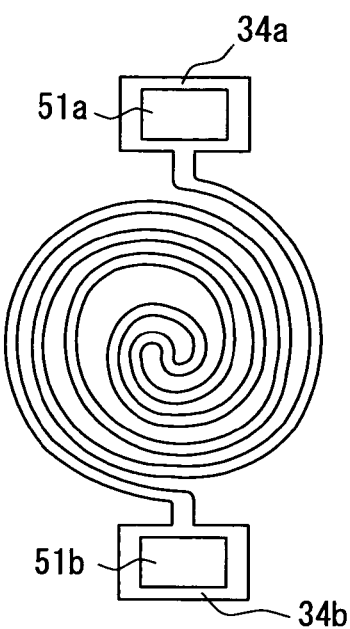
FIG. 8 is a diagram illustrating a top view of a gauge section of a semiconductor pressure sensor according to another modification of the first embodiment.

According to the first embodiment, the gauge section 31 has a zigzag shape formed by the straight and bent portions 32, 33. Alternatively, the gauge section 31 can have a shape other than a zigzag shape. For example, the gauge section 31 may have a straight shape or a spiral shape illustrated in FIG. 8. In short, the gauge section 31 can have any shape that allows an electrical resistance of the gauge section 31 to be set to a desired value.

Figure 9A:
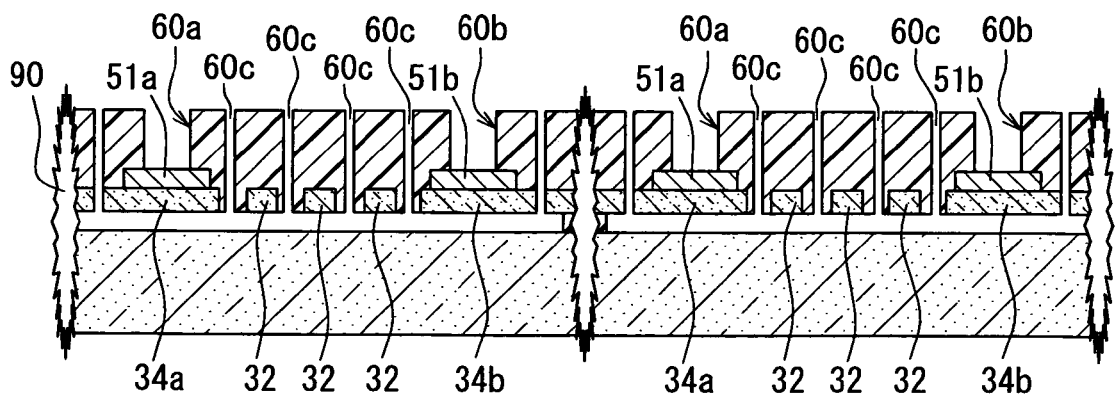
FIGS. 9A, 9B are diagrams illustrating another manufacturing method of the semiconductor pressure sensor of FIG. 1.

According to the modification of the first embodiment, the insulating layer 20 is removed by mechanically polishing the SOI substrate from its back side. Alternatively, the insulating layer 20 can be removed by a wet etching from the front side of the SOI substrate. Specifically, as shown in FIG. 9A, multiple holes 60c reaching the insulating layer 20 are formed from the front side of the SOI substrate. The holes 60c are formed to avoid the first and second bonding pads 34a, 34b and the straight and bent portions 32, 33. Then, etching solution is poured into the holes 60c. As a result, the insulating layer 20 located directly under the gauge section 31 is gradually dissolved. Thus, the insulating layer 20 can be removed by a wet etching from the front side of the SOI substrate.

Figure 9B:
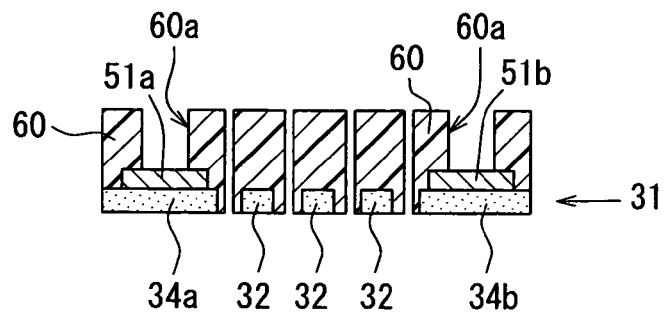

In FIG. 9A, the insulating layer 20 is partially removed, i.e., partially left. In such an approach, as shown in FIG. 9B, the gauge sections 31 can be separated from each other by cutting the SOI substrate with a dicing saw 90. Alternatively, the insulating layer 20 may be fully removed to remove the base substrate 10.

According to the first embodiment, the thickness of the semiconductor layer 30 is about 1 μm, and the total thickness of the SOI substrate is about 8 μm. Alternatively, the thickness of the semiconductor layer 30 can be equal to or greater than 1 μm and equal to or less than 2 μm, and the total thickness of the SOI substrate can be equal to or less than 10 μm.

According to the first embodiment, the semiconductor layer 30 has an uniform impurity concentration within a range of about between $1 \times 10^{19}$ cm$^{-3}$ and $1 \times 10^{20}$ cm$^{-3}$. The impurity concentration of the semiconductor layer 30 can exceed the range, as long as the impurity concentration is uniform over the semiconductor layer 30.

According to the first embodiment, due to factors resulting from manufacturing processes of the SOI substrate, the semiconductor layer 30 has an uniform impurity concentration. Alternatively, the impurity concentration of the semiconductor layer 30 can be uniform by ion-implantation and thermal diffusion processes applied to the semiconductor layer 30. Specifically, ions implanted into the semiconductor layer 30 remain in the semiconductor layer 30 without reaching the base substrate 10 through the buried insulating layer 20. The ions remaining in the semiconductor layer 30 are uniformly diffused over the semiconductor layer 30 by the thermal diffusion process. Thus, the impurity concentration of the semiconductor layer 30 can be uniform.

According to the first embodiment, the semiconductor sensor 1 is configured as a pressure sensor to detect pressure. Alternatively, the semiconductor sensor 1 can be configured to detect other physical quantity than pressure, as long as the gauge section 31 can be deformed according to the physical quantity so that the resistance of the gauge section 31 can be changed according to the physical quantity. For example, the semiconductor sensor 1 can be configured as a load sensor to detect load applied to the gauge section 31. Alternatively, the semiconductor sensor 1 can be configured as a temperature sensor to detect the ambient temperature of the gauge section 31. When the semiconductor sensor 1 is configured as a temperature sensor, it is preferable that the semiconductor layer 30 have an uniform impurity concentration within a range of about between $1\times10^{19}$ cm$^{-3}$ and $1\times10^{21}$ cm$^{-3}$. In such an approach, temperature characteristics of the semiconductor sensor 1 can be stabilized.

According to the first embodiment, the adhesive member 80, through which the semiconductor sensor 1 is bonded to the thinned portion 70b of the stem 70, can be other than a low melting glass. For example, the adhesive member 80 can be an organic adhesive, polyimide resin, silver paste, or the like. When the stem 70 is made of a metallic material, the semiconductor sensor 1 can be directly bonded to the stem 70 without the adhesive member 80 in a manner described below.

Second Embodiment

A pressure sensing apparatus 200 according to a second embodiment of the present invention is described below with reference to FIGS. 10, 11. For example, the pressure sensing apparatus 200 is installed to a fuel pipe (not shown) of a fuel injection system (e.g., common-rail system) of a vehicle and used to detect pressure of fuel in the fuel pipe.

Figure 10:
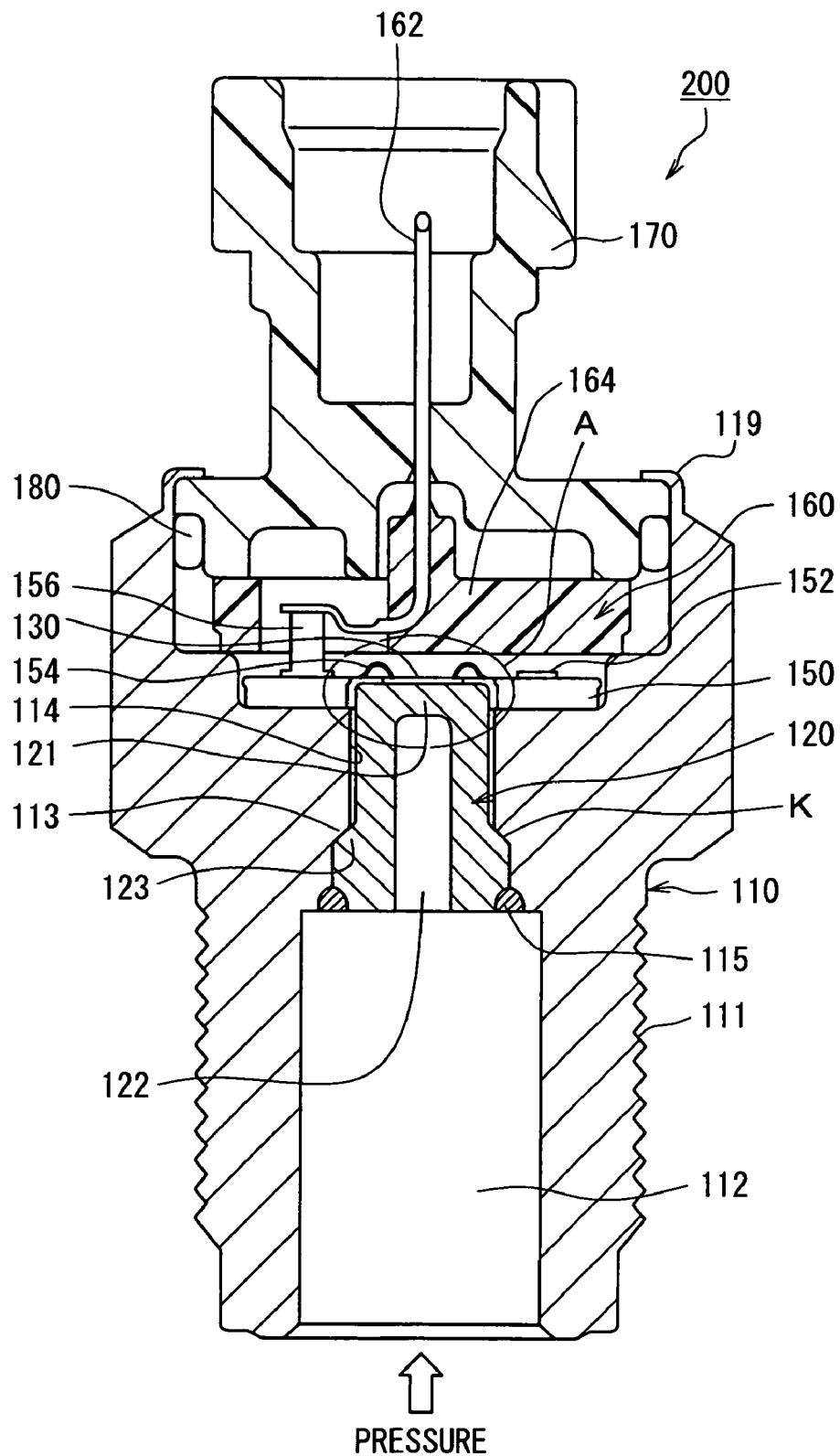
FIG. 10 is a diagram illustrating a cross-sectional view of a pressure sensing apparatus according to a second embodiment of the present invention.

As shown in FIG. 10, the pressure sensing apparatus 200 includes a housing 110 having an outer surface provided with a screw thread 111. The housing 110 is directly fixed to the fuel pipe by means of the screw thread 111. A pressure passageway 112 is formed inside the housing 110. The pressure passageway 112 has a first side (i.e., bottom side of FIG. 10) provided with a pressure inlet port for introducing the pressure into the pressure passageway 112 and a second side (i.e., top side of FIG. 10) provided with a stem room 114. When the housing 110 is fixed to the fuel pipe, the pressure passageway 112 communicates with an inside of the fuel pipe so that the fuel pressure is introduced from the fuel pipe into the pressure passageway 112 through the pressure inlet port.

For example, the housing 110 can be made of a stainless steel (e.g., SUS430, SUS304, or SUS630), which has excellent corrosion resistance. Alternatively, the housing 110 can be made of a material other than a stainless steel. For example, the housing 110 can be made of a carbon steel (e.g., S15C) having high strength and excellent corrosion resistance, a zinc-plated carbon steel having improved corrosion resistance, or SUSXM7 having excellent corrosion resistance.

A hollow cylindrical metallic stem 120 is received in the stem room 114 of the pressure passageway 112. The metallic stem 120 has an opening 122 on a first side (i.e., bottom side of FIG. 10) and a wall on a second side (i.e., top side of FIG. 10). The wall is thinned to form a diaphragm 121 used for detecting pressure. The pressure is introduced from the pressure passageway 112 into the diaphragm 121 through the opening 122. The metallic stem 120 has an expansion portion 123 on its outer surface. The expansion portion 123 causes the metallic stem 120 to have a taper shape so that an outer diameter of the metallic stem 120 is smaller on the top side of FIG. 10 than on the bottom side of FIG. 10.

The stem room 114 of the pressure passageway 112 is formed corresponding to an outer shape of the metallic stem 120 so that the metallic stem 120 can be fitted into the stem room 114. The stem room 114 has an stopper portion 113 on its inner surface. The stopper portion 113 causes the stem room 114 to have a taper shape so that an inner diameter of the stem room 114 is smaller on the top side of FIG. 10 than the bottom side of FIG. 10.

When the metallic stem 120 is received in the stem room 114 of the pressure passageway 112, an edge of the metallic stem 120 is aligned with an edge 114a of the stem room 114. The edge of the metallic stem 120 is welded to the edge 114a of the stem room 114 by a welding member 115 so that the metallic stem 120 is fixed to the stem room 114 of the pressure passageway 112 with the expansion portion 123 of the metallic stem 120 pressed against the stopper portion 113 of the stem room 114 of the pressure passageway 112.

In such an approach, the expansion portion 123 and the stopper portion 113 are in tight contact with each other to form a sealing portion K. The sealing portion K seals between the housing 110 and the metallic stem 120, specifically, between the inner surface of the stem room 114 of the pressure passageway 112 and the outer surface of the metallic stem 120. The sealing between the housing 110 and the metallic stem 120 is achieved by pressing force applied by the expansion portion 123 to the stopper portion 113. A direction of the pressing force is from the bottom side to the top side of FIG. 10. When the pressure to be detected is introduced into the pressure passageway 112, the metallic stem 120 receives force from the introduced pressure. Like the pressing force, a direction of the introduced pressure force is from the bottom side to the top side of FIG. 10. Therefore, when the pressure is measured, the pressing force applied by the expansion portion 123 to the stopper portion 113 is increased by the introduced pressure force so that the sealing between the housing 110 and the metallic stem 120 can be ensured. As the introduced pressure is larger, the sealing between the housing 110 and the metallic stem 120 is improved.

A sensor chip 130 mainly made of monocrystalline silicon (Si) is directly bonded to the diaphragm 121. Since the main material of the sensor chip 130 is silicon, the metallic stem 120 needs to be made of a material having a Young's modulus close to a Young's modulus of silicon. Further, since the metallic stem 120 is subject to high pressure, the metallic stem 120 needs to be made of a material having high strength. Further, since the metallic stem 120 is welded to the housing 110, the metallic stem 120 needs to be made of the same material as the housing 110. Further, since the metallic stem 120 has the cylindrical shape, the metallic stem 120 needs to be made of a material having good workability. In the present embodiment, therefore, the metallic stem 120 is made of the same material as the housing 110 and may be, for example, made of a stainless steel.

The sensor chip 130 serves as a strain gauge and detects strain caused when the diaphragm 121 is deformed by the pressure introduced to the diaphragm 121 through the opening 122.

Figure 11:
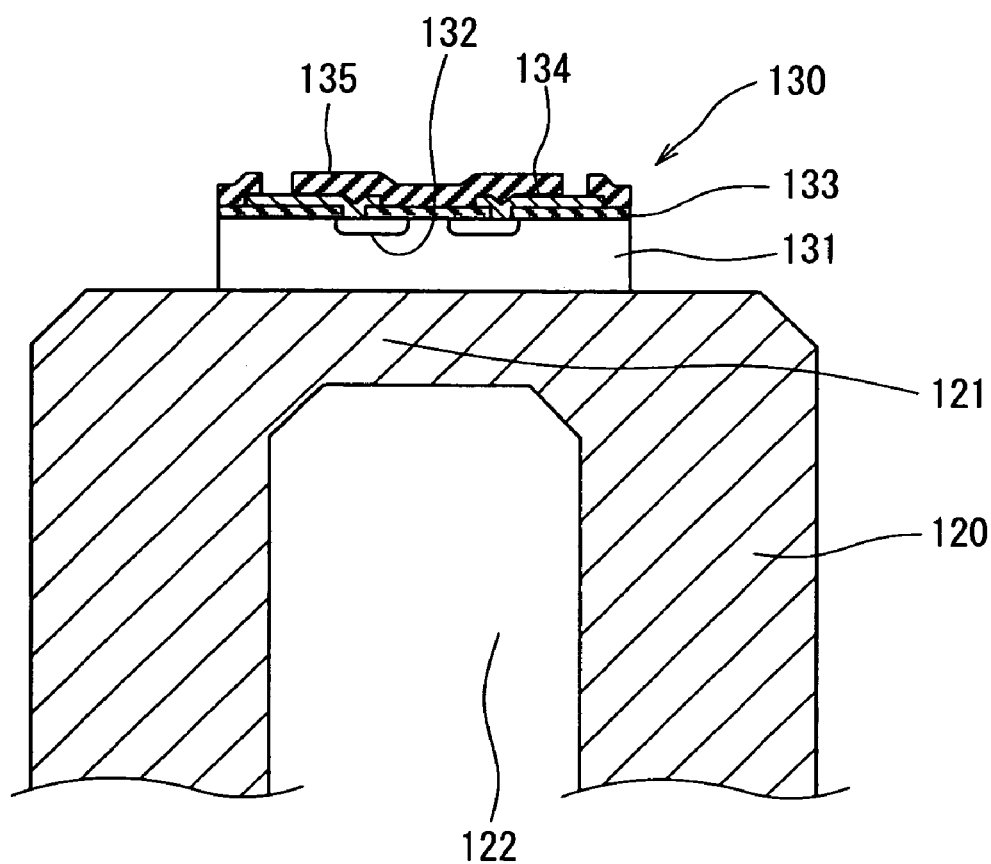
FIG. 11 is a diagram illustrating a partially-enlarged view of an encircled portion of FIG. 10.

As illustrated in FIG. 11, the sensor chip 130 includes a monocrystalline silicon substrate 131, a strain gauge 132, an insulation film 133, a wiring member 134, and a protection film 135 The monocrystalline silicon substrate 131 has a front surface and a back surface. The strain gauge 132 is formed to a surface portion of the front surface of the monocrystalline silicon substrate 131 and, for example, constructed with impurity layers that are formed to the surface portion and arranged in a Wheatstone bridge configuration. The insulation film 133 is disposed on the front surface of the monocrystalline silicon substrate 131 to cover the front surface of the monocrystalline silicon substrate 131. The insulation film 133 has contact holes 133a, through which predetermined portions of the strain gauge 132 are exposed outside the insulation film 133. The wiring member 134 is electrically connected to the exposed portions of the strain gauge 132 through the contact holes 133a. The protection film 135 is disposed on the wiring member 134 to cover the wiring member 134. The protection film 135 has opening holes, through which electrical pads of the wiring member 134 are exposed outside the protection film 135. The back surface of the monocrystalline silicon substrate 131 is directly bonded to the front surface of the diaphragm 121 of the metallic stem 120.

Returning to FIG. 10, the diaphragm 121 projects from the inner surface of the housing 110 on the top side of FIG. 10. A ceramic circuit board 150 is mounted to the housing 110 to surround the diaphragm 121. For example, the ceramic circuit board 150 is bonded to the inner surface of the housing 110 by an adhesive. An integrated circuit (IC) chip 152 having an amplifier circuit for amplifying an output of the sensor chip 130, a characteristic compensation circuit, and the like is fixed to the ceramic circuit board 150 by an adhesive.

The IC chip 152 is wire-bonded to a conductor portion of the ceramic circuit board 150 by an aluminum bonding wire 154. A pin 156 is silver brazed to the conductor portion of the ceramic circuit board 150.

The pressure sensing apparatus 200 includes a connector assy 160 that has a connector terminal 162 made of an electrically conducting material and a connector body 164 made of resin. The connector terminal 162 is insert-molded with the connector body 164. The connector terminal 162 is laser-welded to the pin 156. Thus, the ceramic circuit board 150 is electrically connected to the connector terminal 162 through the pin 156, and the pressure sensing apparatus 200 is electrically connectable to an external device such as a vehicle electronic control unit (ECU) through the connector terminal 162. The connector assy 160 is fixed and held between a connector casing 170 and the housing 110.

The connector casing 170 provides an outer shape of the connector assy 160. The connector casing 170 is integrally joined to the housing 110 through an O-ring 180. Thus, the housing 110 and the connector casing 170 are integrated into a sensor package so that the electrical components (e.g., sensor chip 130) placed inside the sensor package can be protected from moisture, mechanical external force, and the like. The connector casing 170 may be, for example, made of polyphenylene sulfide (PPS), which has high hydrolysis resistance.

Figure 12:
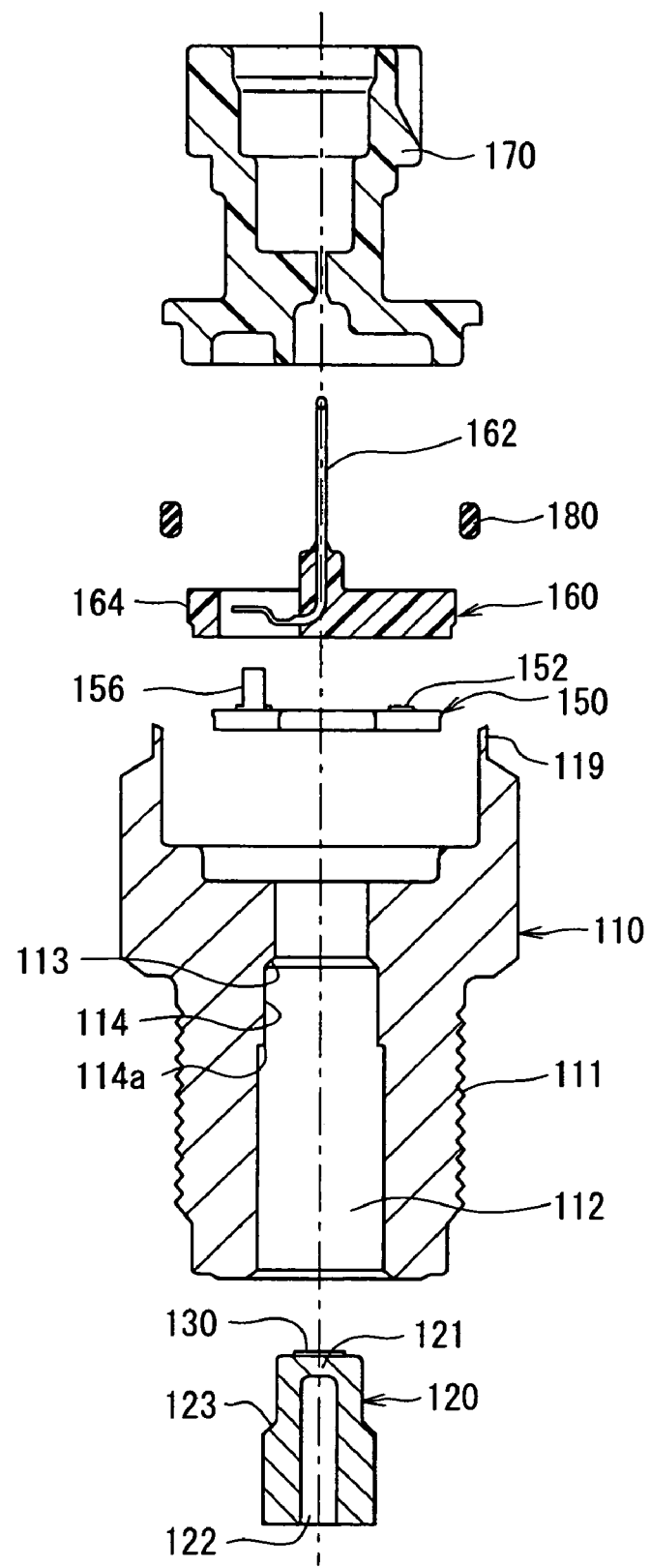
FIG. 12 is a diagram illustrating an exploded view of FIG. 10.
Figure 13:
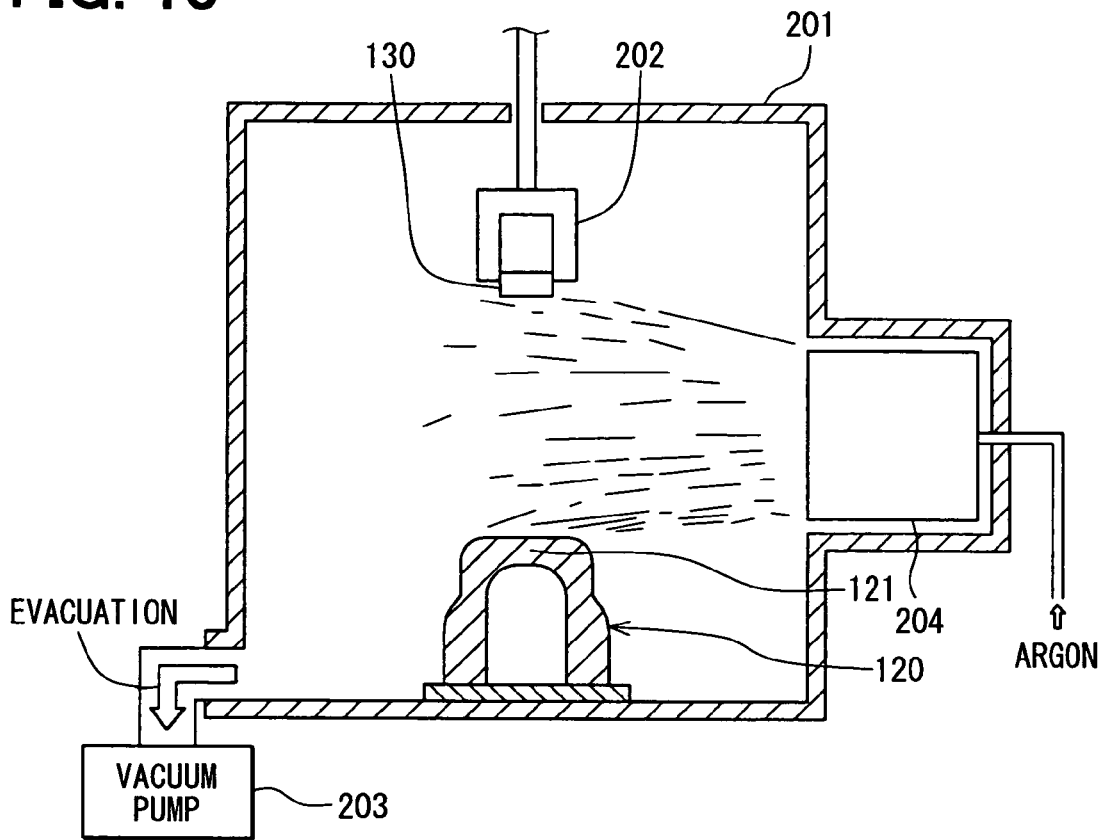
FIG. 13 is a diagram illustrating a bonding process in which a sensor chip is directly bonded to a stem of the pressure sensing apparatus of FIG. 10.

A method of manufacturing the pressure sensing apparatus 200 is described below with reference to FIGS. 12, 13. First, the sensor chip 130 is directly bonded to the metallic stem 120 in a vacuum chamber 201. Specifically, the sensor chip 130 is held by a holding arm 202 in the vacuum chamber 201, after the back surface of the sensor chip 130 and the front surface of the diaphragm 121 of the metallic stem 120 are cleaned if necessary. Then, the vacuum chamber 201 is evacuated to a predetermined vacuum level by a vacuum pump 203. After the evacuation of the vacuum chamber 201 is finished, a high-speed argon beam is applied to the back surface of the sensor chip 130 and the front surface of the diaphragm 121 by using a beam irradiator 204. The application of the high-speed argon beam activates the back surface of the sensor chip 130 and the front surface of the diaphragm 121 so that the activated surfaces can easily form a chemical bond with other atoms. Then, the back surface of the sensor chip 130 is bonded to the front surface of the diaphragm 121 of the metallic stem 120 by operating the holding arm 202.

In normal conditions, even when the back surface of the sensor chip 130 and the front surface of the diaphragm 121 are activated, the activated surfaces are covered with a molecule such as a water molecule. Therefore, the sensor chip 130 and the diaphragm 121 cannot be strongly bonded together.

Since such a molecule covering the activated surfaces does not exist in the vacuum chamber 201 kept at the predetermined vacuum level, the activated surfaces can easily form a chemical bond with other atoms in the vacuum chamber 201. Therefore, the sensor chip 130 and the diaphragm 121 can be strongly bonded together in the vacuum chamber 201. In this case, there is no need to increase a temperature inside the vacuum chamber 201. For example, the sensor chip 130 and the diaphragm 121 can be strongly bonded together at a room temperature.

The activation of the back surface of the sensor chip 130 and the front surface of the diaphragm 121 of the metallic stem 120 is archived by removing surface portions of the back surface of the sensor chip 130 and the front surface of the diaphragm 121. Therefore, the back surface of the sensor chip 130 and the front surface of the diaphragm 121 can be activated by means other than the high-speed argon beam. For example, the back surface of the sensor chip 130 and the front surface of the diaphragm 121 may be activated by using an ion beam other than an argon. Alternatively, the back surface of the sensor chip 130 and the front surface of the diaphragm 121 may be activated by a sputter etching process using plasma (e.g., O2 plasma, N2 plasma).

After the sensor chip 130 is directly bonded to the diaphragm 121 of the metallic stem 120 in the above-mentioned manner, the metallic stem 120 is inserted in the pressure passageway 112 of the housing 110 through the pressure inlet port of the pressure passageway 112 in such a manner that the diaphragm 121 is initially inserted. When the metallic stem 120 is received in the stem room 114 of the pressure passageway 112, the edge 114a of the stem room 114 and the edge of the metallic stem 120 are laser-welded together by the welding member 115, with the expansion portion 123 of the metallic stem 120 pressed against the stopper portion 113 of the stem room 114.

Thus, the expansion portion 123 and the stopper portion 113 are in tight contact with each other to form the sealing portion K. The metallic stem 120 is fixed to the housing 110 by the welding member 115 in such a manner that the sealing between the housing 110 and the metallic stem 120 is ensured so that the pressure introduced in the pressure passageway 112 of the housing 110 can be applied to the diaphragm 121 of the metallic stem 120 without leaking.

Then, the ceramic circuit board 150, on which the IC chip 152 and the pin 156 are mounted, is fixed by an adhesive to the inner surface of the housing 110 to surround the diaphragm 121 of the metallic stem 120. Thus, the sensor chip 130 can be approximately at the same level as the ceramic circuit board 150. Then, the sensor chip 130 and the ceramic circuit board 150 are wire-bonded together through the aluminum bonding wire 154.

Then, the connecter terminal 162 of the connector assy 160 and the pin 156 mounted to the ceramic circuit board 150 are laser-welded together by YAG laser welding, for example. The connector casing 170 is attached to the housing 110 through the O-ring 180 and fixed to the housing 110 by bending a hook 119 of the housing 110 to catch the connector casing 170. Thus, the pressure sensing apparatus 200 illustrated in FIG. 10 is completed.

The pressure sensing apparatus 200 is mounted to the fuel pipe by inserting the screw thread 111 of the housing 110 in a screw hole (not shown) of the fuel pipe. The fuel pressure in the fuel pipe is introduced in the pressure passageway 112 of the housing 110 and then applied to the diaphragm 121 of the metallic stem 120 through the opening 122 of the metallic stem 120. The diaphragm 121 is deformed by the pressure.

The deformation of the diaphragm 121 is converted to an electrical signal by the sensor chip 130. The electrical signal is processed by a processing circuit of the ceramic circuit board 150 so that the pressure can be detected. The vehicle ECU (not shown) controls fuel injection based on the detected pressure. The processing circuit can be integrated in the sensor chip 130 instead of the ceramic circuit board 150. In such an approach, the ceramic circuit board 150 can be eliminated so that the number of parts of the pressure sensing apparatus 200 can be reduced. The manufacturing cost and the size of the pressure sensing apparatus 200 can be reduced accordingly.

As described above, according to the pressure sensing apparatus 200, the back surface of the sensor chip 130 is directly bonded to the front surface of the diaphragm 121. Thus, since the sensor chip 130 is bonded to the diaphragm 121 without low-melting glass, the metallic stem 120 can be made of a material other than kovar, which is costly and has less workability. For example, the metallic stem 120 can be made of stainless steel (SUS), which is cheap and has high workability as compared to kovar. Since the housing 110 and the metallic stem 120 can be made of the same material, the metallic stem 120 can be fixed to the housing 110 by means of welding.

Third Embodiment

Figure 14:
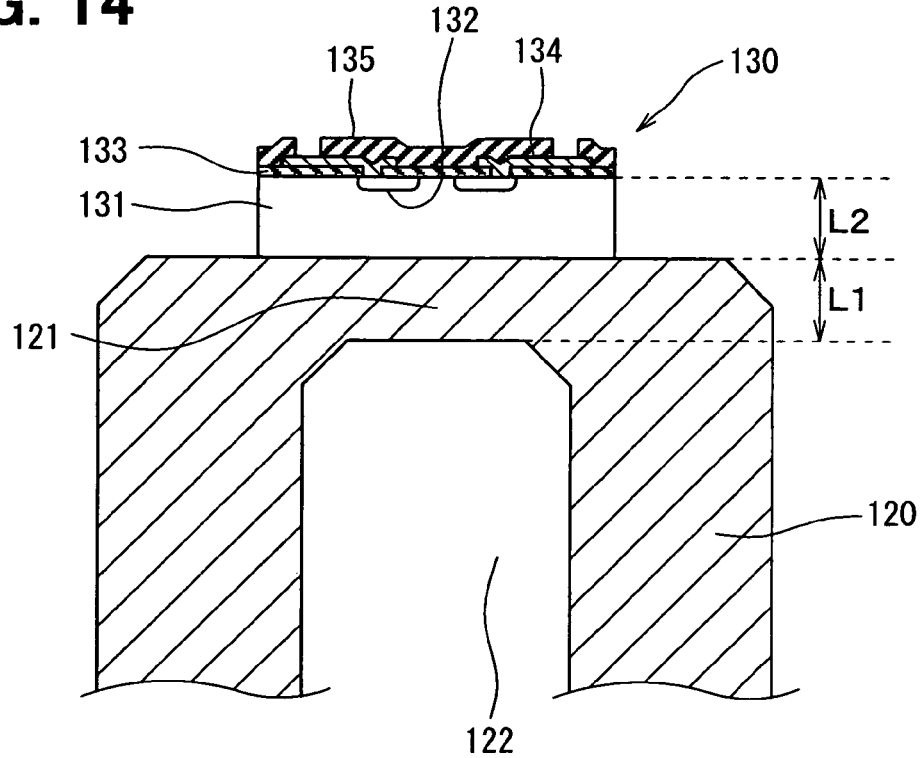
FIG. 14 is a diagram, corresponding to FIG. 11, illustrating a cross-sectional view of a sensor chip and a stem of a pressure sensing apparatus according to a third embodiment of the present invention.

A third embodiment of the present invention is described below with reference to FIG. 14. A difference between the second and third embodiment is as follows. According to the third embodiment, a thickness L1 of the diaphragm 121 is set equal to a thickness L2 of the sensor chip 130. Specifically, after the strain gauge 132 and the insulation film 133 are formed to the front surface of the silicon substrate 131, the back surface of the silicon substrate 131 is grinded or polished until the thickness L1 of the diaphragm 121 becomes equal to the thickness L2 of the sensor chip 130.

The sensor chip 130 and the diaphragm 121 are thermally expanded and shrunk, when the pressure sensing apparatus 200 is manufactured and receives pressure. As a result, while one of the sensor chip 130 and the diaphragm 121 receives extensive stress, the other of the sensor chip 130 and the diaphragm 121 receives compressive stress. The sensor chip 130 and the diaphragm 121 have a similar Young's modulus value. Specifically, a Young's modulus value of the sensor chip 130 (i.e., silicon) is 170 GPa, and a Young's modulus value of the diaphragm 121 (i.e., stainless steel) is 190 GPa. Therefore, the stress exerted on the interface between the sensor chip 130 and the diaphragm 121 can be reduced by setting the thickness L1 of the diaphragm 121 equal to the thickness L2 of the sensor chip 130. Thus, the sensor chip 130 and the diaphragm 121 can be reliably bonded together for a long period of time.

Fourth Embodiment

Figure 15:
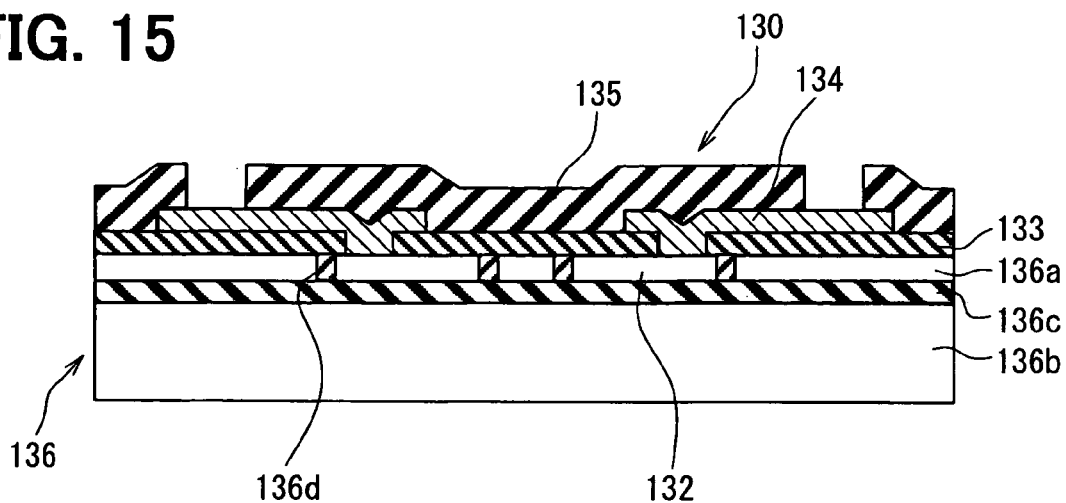
FIG. 15 is a diagram illustrating a cross-sectional view of a sensor chip of a pressure sensing apparatus according to a fourth embodiment of the present invention.

A fourth embodiment of the present invention is described below with reference to FIG. 15. A difference between the second and fourth embodiment is as follows. According to the fourth embodiment, the sensor chip 130 is constructed with a silicon-on-insulator (SOI) substrate 136, not a monocrystalline silicon substrate 131. As shown in FIG. 15, the strain gauge 132, the insulation film 133, the wiring member 134, and the protection film 135 are formed to the SOI substrate 136. The SOI substrate 136 is constructed in such a manner that a silicon layer 136a is bonded to a base substrate 136b through an insulation layer 136c. For example, the SOI substrate 136 is formed as follows.

In one method of forming the SOI substrate 136, a silicon substrate is bonded to the base substrate 136b, and then the silicon substrate is polished or grinded to form the silicon layer 136a. In another method of forming the SOI substrate 136, a silicon thin film is evaporated on the base substrate 136b, solid-phase grown, and crystallized by laser annealing to form the silicon layer 136a. The strain gauge 132 is formed to the silicon layer 136a and enclosed by an insulation film 136d so that adjacent strain gauges 132 can be electrically separated from each other.

Since the sensor chip 130 is constructed with the SOI substrate 136, the strain gauge 132 of the sensor chip 130 can operate even at a high temperature. Therefore, the pressure sensing apparatus 200 can be used in a high-temperature environment such as an engine combustion chamber to detect combustion pressure.

(First Modification of Fourth Embodiment)

Figure 16:
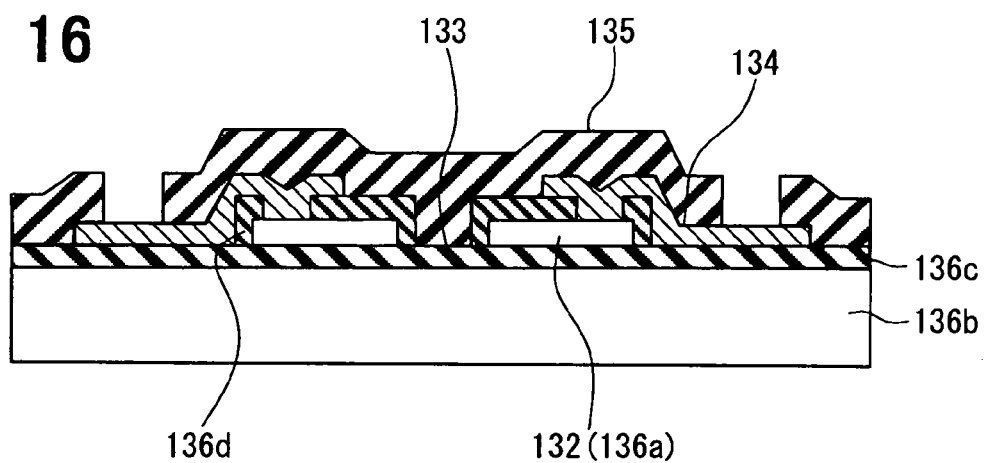
FIG. 16 is a diagram illustrating a cross-sectional view of a sensor chip of a pressure sensing apparatus according to a modification of the fourth embodiment.

A first modification of the fourth embodiment of the present invention is described below with reference to FIG. 16. According to the first modification of the fourth embodiment, the strain gauge 132 is formed into a mesa structure by removing the silicon layer 136a in such a manner that only the strain gauge 132 is left. When adjacent strain gauges 132 are electrically separated from each other, the strain gauge 132 can be formed into the mesa structure.

(Second Modification of Fourth Embodiment)

A second modification of the fourth embodiment of the present invention is described below. Although the base substrate 136b can be made of various types of materials, it is preferable that the base substrate 136b be made of a material having a thermal expansion coefficient that is between a thermal expansion coefficient (about $33 \times 10^{-7}/° C.$) of silicon and a thermal expansion coefficient of a material of the metallic stem 120. For example, when the metallic stem 120 is made of SUS304, which has a thermal expansion coefficient of about $170 \times 10^{-7}/° C.$, it is preferable that the base substrate 136b be made of a material having a thermal expansion coefficient between $33 \times 10^{-7}/° C.$ and $170 \times 10^{-7}/° C.$ for the following reasons.

As previously mentioned the sensor chip 130 and the diaphragm 121 are thermally expanded and shrunk when the pressure sensing apparatus 200 is manufactured and receives pressure. Since the sensor chip 130 and the diaphragm 121 can be directly bonded together at room temperatures, the stress exerted on the interface between the sensor chip 130 and the diaphragm 121 can be reduced to zero during manufacture of the pressure sensing apparatus 200. However, a temperature change occurs during use of the pressure sensing apparatus 200, and the stress due to the temperature change is applied to the interface between the sensor chip 130 and the diaphragm 121.

In the second embodiment, since the monocrystalline silicon substrate 131 is directly bonded to the diaphragm 121 without the base substrate 136b, the stress applied to the interface between the silicon substrate 131 and the diaphragm 121 depends on a difference in a thermal expansion coefficient between the silicon substrate 131 and the diaphragm 121. Therefore, large stress may be applied to the interface.

In the fourth embodiment, the silicon layer 136a is bonded to the diaphragm 121 through the base substrate 136b. Therefore, when the base substrate 136b is made of a material having a thermal expansion coefficient that is between a thermal expansion coefficient of silicon and a thermal expansion coefficient of a material of the metallic stem 120, the stress applied to the interface between the sensor chip 130 and the diaphragm 121 can be distributed between a first interface between the diaphragm 121 and the base substrate 136b and a second interface between the base substrate 136b and the silicon layer 136a. Thus, the sensor chip 130 and the diaphragm 121 can be reliably bonded together for a long period of time. For example, the base substrate 136b can be made of Corning 7059 glass having a thermal expansion coefficient of about $46 \times 10^{-7}/^\circ$ C. or alumina having a thermal expansion coefficient of about $70 \times 10^{-7}/^\circ$ C.

Fifth Embodiment

Figure 17:
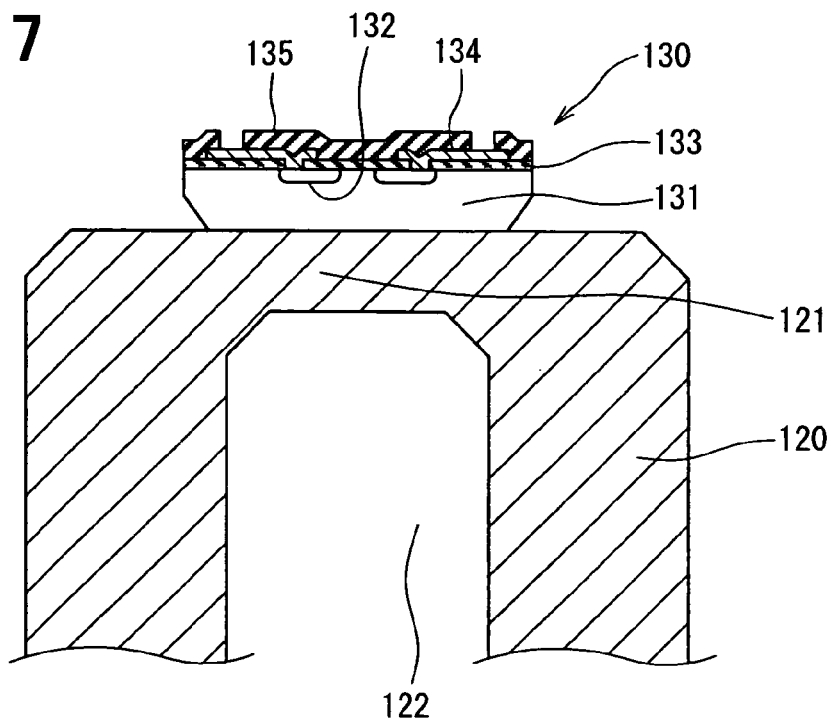
FIG. 17 is a diagram, corresponding to FIG. 11, illustrating a cross-sectional view of a sensor chip and a stem of a pressure sensing apparatus according to a fifth embodiment of the present invention.

A fifth embodiment of the present invention is described below with reference to FIG. 17. A difference between the second and fifth embodiment is as follows. According to the fifth embodiment, four edges of the sensor chip 130 is cut so that each corner of the back surface of the sensor chip 130 has an obtuse angle.

It is likely that stress applied to the interface between the diaphragm 121 and the sensor chip 130 is concentrated on corners of the interface, i.e., corners of the back surface of the sensor chip 130. The concentration of the stress can be reduced by increasing angles of corners of the back surface of the sensor chip 130. Therefore, when each corner of the back surface of the sensor chip 130 has an obtuse angle, the stress can be reduced so that the sensor chip 130 and the diaphragm 121 can be reliably bonded together for a long period of time.

Sixth Embodiment

Figure 18:
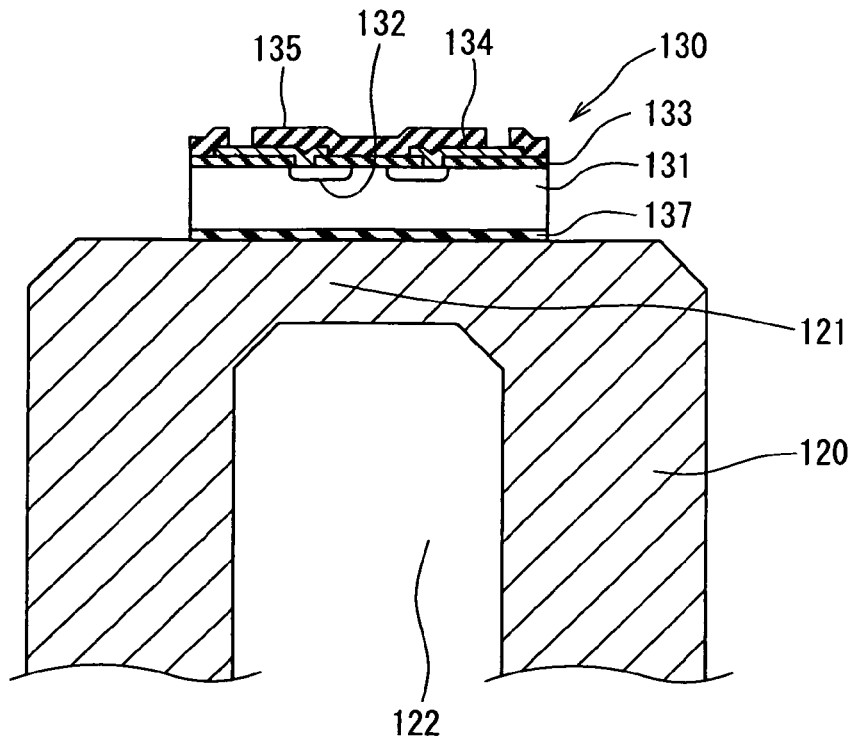
FIG. 18 is a diagram, corresponding to FIG. 11, illustrating a cross-sectional view of a sensor chip and a stem of a pressure sensing apparatus according to a sixth embodiment of the present invention.

A sixth embodiment of the present invention is described below with reference to FIG. 18. A difference between the second and sixth embodiment is as follows. According to the sixth embodiment, the back surface of the sensor chip 130 (i.e., the back surface of the monocrystalline silicon substrate 131) is provided with an insulation film 137. Therefore, electrostatic attraction force can be generated between the silicon substrate 131 and the metallic stem 120 by applying a voltage to the silicon substrate 131 through the wiring member 134. The sensor chip 130 and the diaphragm 121 can be accurately bonded together by using the electrostatic attraction force. Thus, yield of bonding of the sensor chip 130 with respect to the diaphragm 121 is increased.

Seventh Embodiment

Figure 19:
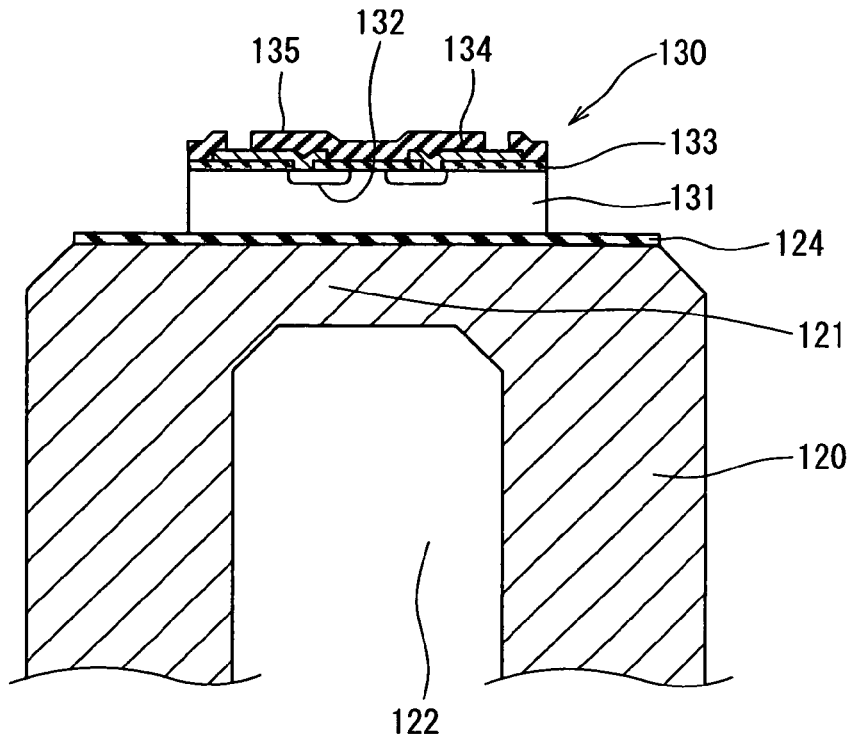
FIG. 19 is a diagram, corresponding to FIG. 11, illustrating a cross-sectional view of a sensor chip and a stem of a pressure sensing apparatus according to an seventh embodiment of the present invention.

A seventh embodiment of the present invention is described below with reference to FIG. 19. A difference between the second and seventh embodiment is as follows. According to the seventh embodiment, the front surface of the diaphragm 121 is provided with an insulation film 124. Therefore, like the sixth embodiment, electrostatic attraction force can be generated between the silicon substrate 131 and the metallic stem 120 by applying a voltage to the silicon substrate 131 through the wiring member 134. The sensor chip 130 and the diaphragm 121 can be accurately bonded together by using the electrostatic attraction force. Thus, yield of bonding of the sensor chip 130 with respect to the diaphragm 121 is increased.

(Modifications)

The embodiments described above may be modified in various ways. For example, the sensor chip 130 can be directly bonded to the metallic stem 120 by a method other than the activation of the surfaces of the metallic stem 120 and the sensor chip 130. The pressure sensing apparatus 200 can be configured to detect pressure other than the fuel pressure in the fuel pipe of the fuel injection system of a vehicle.

Such changes and modifications are to be understood as being within the scope of the present invention as defined by the appended claims.

What is claimed is:

1. A semiconductor sensor comprising:
   a body including a hollow tube portion and a bottom portion for covering an opening of the tube portion, the bottom portion being thinned to a predetermined thickness that allows the bottom portion to be deformed according to pressured applied thereto;
   an insulating layer; and
   a semiconductor layer disposed on the insulating layer, the semiconductor layer having at least one gauge section including a sensing portion configured to be deformed according to an amount of physical quantity applied thereto, the gauge section further including first and second bonding pads respectively connected to different positions of the sensing portion,
   wherein the gauge section is mounted to only the bottom portion of the body, and
   wherein an electrical resistance between the first and second bonding pads changes with a change in the amount of the applied physical quantity.

2. The semiconductor sensor according to claim 1, further comprising:
   a base substrate disposed under the insulating layer,
   wherein the semiconductor layer, the insulating layer, and the base substrate are configured as a silicon-on-insulator substrate.

3. The semiconductor sensor according to claim 2,
   wherein the semiconductor layer has a thickness of about between 1 micrometer and 2 micrometers, and
   wherein the silicon-on-insulator substrate has a thickness less than about 10 micrometers.

4. The semiconductor sensor according to claim 1,
   wherein the semiconductor layer has an impurity concentration of about between $1 \times 10^{19}$ per cubic centimeter and $1 \times 10^{21}$ per cubic centimeter.

5. The semiconductor sensor according to claim 1, wherein the gauge section has a plurality of straight and bent portions connected to each other to form a zigzag shape.

6. The semiconductor sensor according to claim 1, further comprising:
an electrically insulating film that covers the gauge section.

7. The semiconductor sensor according to claim 6, further comprising:
a first protection film disposed on the insulating film to protect the gauge section, the first protection film being used to mount the gauge section to the bottom portion.

8. The semiconductor sensor according to claim 7, further comprising:
a second protection film disposed between the insulating film and the first protection film to protect the gauge section.

9. The semiconductor sensor according to claim 1, wherein the semiconductor layer having a plurality of gauge sections arranged in series.

10. The semiconductor sensor according to claim 1, wherein the physical quantity is pressure.

11. The semiconductor sensor according to claim 1, wherein the physical quantity is a temperature.

12. A method of manufacturing a semiconductor sensor comprising:
preparing a silicon-on-insulator substrate that includes a base substrate, a buried insulating layer disposed on the base substrate, and a semiconductor layer disposed on the insulating layer;
forming a gauge section by etching the semiconductor layer, the gauge section including a sensing portion configured to deformed according to an amount of physical quantity applied thereto and first and second bonding pads connected to different positions of the sensing portion;
covering the gauge section with an electrical insulating film;
forming a first protection film on the insulating film to protect the gauge section;
eliminating the base substrate and the buried insulating layer from a back side of the silicon-on-insulator substrate;
preparing a body having a thinned portion; and
mounting the gauge section to the thinned portion by holding the first protection film.

13. The method according to claim 12, further comprising:
forming a second protection film between the insulating film and the first protection film to protect the gauge section.

14. A method of manufacturing a semiconductor sensor, comprising:
preparing a silicon-on-insulator substrate that includes a base substrate, a buried insulating layer disposed on the base substrate, and a semiconductor layer disposed on the insulating layer;
forming a gauge section by etching the semiconductor layer, the gauge section including a sensing portion configured to deformed according to an amount of physical quantity applied thereto and first and second bonding pads connected to different positions of the sensing portion;
covering the gauge section with an electrical insulating film;
forming a first protection film on the insulating film to protect the gauge section;
forming a plurality of through holes extending from a top surface of the first protection film to a top surface of the buried insulating layer;
wet etching the buried insulating layer through the plurality of through holes to partially remove the buried insulating layer;
removing a remainder of the buried insulating layer and the base substrate by using a dicing saw:
preparing a body having a thinned portion; and
mounting the gauge section to the thinned portion by holding the first protection film.

15. The method according to claim 14, further comprising:
forming a second protection film between the insulating film and the first protection film to protect the gauge section.

16. A method of manufacturing a semiconductor sensor, comprising:
preparing a silicon-on-insulator substrate that includes a base substrate, a buried insulating layer disposed on the base substrate, and a semiconductor layer disposed on the insulating layer;
forming a gauge section by etching the semiconductor layer, the gauge section including a sensing portion configured to be deformed according to an amount of physical quantity applied thereto and first and second bonding pads connected to different positions of the sensing portion;
covering the gauge section with an electrical insulating film;
forming a first protection film on the insulating film to protect the gauge section;
forming a plurality of through holes extending from a top surface of the first protection film to a top surface of the buried insulating layer;
wet etching the buried insulating layer through the plurality of through holes to completely remove the buried insulating layer;
preparing a body having a thinned portion; and
mounting the gauge section to the thinned portion by holding the first protection film.

17. The method according to claim 16, further comprising:
forming a second protection film between the insulating film and the first protection film to protect the gauge section.

* * * * *

UNITED STATES PATENT AND TRADEMARK OFFICE
Certificate

Patent No. 7,644,623 B2

Patented: January 12, 2010

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Hisanori Yokura, Obu (JP); and Yoshihiko Isobe, Toyoake (JP).

Signed and Sealed this First Day of March 2011.

LISA CAPUTO
*Supervisory Patent Examiner*
Art Unit 2855
Technology Center 2800